US006971051B2

(12) United States Patent
Taylor et al.

(10) Patent No.: US 6,971,051 B2
(45) Date of Patent: Nov. 29, 2005

(54) SYSTEM AND METHOD OF RECOVERING FROM SOFT MEMORY ERRORS

(75) Inventors: Richard D. Taylor, Eagle, ID (US); Mark D. Montierth, Meridian, ID (US); Melvin D. Bodily, Boise, ID (US); Elizabeth A. Leonard, Sunnyvale, CA (US); Gary Zimmerman, Boise, ID (US)

(73) Assignee: Agilent Technologies, Inc., Palo Alto, CA (US)

( * ) Notice: Subject to any disclaimer, the term of this patent is extended or adjusted under 35 U.S.C. 154(b) by 538 days.

(21) Appl. No.: 10/044,242

(22) Filed: Jan. 10, 2002

(65) Prior Publication Data

US 2003/0131307 A1 Jul. 10, 2003

(51) Int. Cl.[7] .............................................. G11C 29/00
(52) U.S. Cl. ...................... 714/718; 714/763; 365/201
(58) Field of Search ............................... 714/718, 763, 714/766, 733, 780; 365/201

(56) References Cited

U.S. PATENT DOCUMENTS 4,757,503 A * 7/1988 Hayes et al. ................ 714/718
5,414,861 A 5/1995 Horning
5,532,962 A 7/1996 Auclair et al.
5,619,513 A * 4/1997 Shaffer et al. .............. 714/736
5,748,640 A * 5/1998 Jiang et al. ................. 714/720
6,085,334 A * 7/2000 Giles et al. .................... 714/7
6,128,094 A 10/2000 Smith
6,415,403 B1 * 7/2002 Huang et al. ............... 714/726
6,560,733 B1 * 5/2003 Ochoa ........................ 714/723
6,625,749 B1 * 9/2003 Quach ......................... 714/10

* cited by examiner

*Primary Examiner*—Albert Decady
*Assistant Examiner*—Esaw Abraham

(57) ABSTRACT

Managing volatile storage of information, such as executable code within dynamic random access memory (DRAM) embedded within an application specific integrated circuit (ASIC), includes systematically checking the contents of the volatile memory during periods of extended inactivity. Volatile memory checking routines may be initiated on the basis of time, on the basis of a specific event, or on a combination of timing and event occurrences. If a specific error condition is detected, the device in which the volatile memory resides may be automatically reinitialized, so that the corrupt executable code is not used. The information management techniques may be extended to other types of semi-permanent memory i.e., memory that is susceptible to losses in the form of soft errors.

23 Claims, 5 Drawing Sheets

SYSTEM AND METHOD OF RECOVERING FROM SOFT MEMORY ERRORS

TECHNICAL FIELD

The invention relates generally to managing the volatile storage of information and more particularly to assessing the integrity of executable code stored in volatile memory without significantly adding to the cost or the processing overhead of the system in which the volatile memory resides.

BACKGROUND ART

As integrated circuit geometries continue to decline, circuits become more susceptible to both hard errors and soft errors. Hard errors are introduced by contaminants that physically damage the circuitry. For example, a hard error may occur when a particle is lodged in the gate oxide of a dynamic random access memory (DRAM) cell during fabrication. Typically, hard errors require that the entire integrated circuit be discarded. On the other hand, soft errors are transient in nature. In a DRAM, a soft error is an error in memory content that can be corrected by a fresh writing to the DRAM.

In addition to the decline in integrated circuit geometries in order to increase circuit density, reductions in power supply voltages increase the susceptibility of circuits to soft errors. A DRAM cell is able to store a charge in a capacitor, with the charged capacitor representing a logic "one" and a discharged capacitor representing a logic "zero." A lower supply voltage translates into a smaller capacitor charge, so there is a greater likelihood that the charge will be unintentionally depleted to a level at which it will be mistakenly read as logic "zero."

Another factor that affects the susceptibility of a circuit to soft errors relates to the operation of the device in which the circuit resides. Some devices must retain data in internal memories for extended periods of time between actual uses. If the executable code is stored in volatile memory during the periods of inactivity, soft errors in the executable code will accumulate and be undetected until the next use. In a DRAM cell, charge leakage may be the result of bombardment by radiation, such as alpha particles. Alpha particle radiation is generated as a consequence of decay of trace radioactive elements in the packaging material of the integrated circuit chip. With extended periods of inactivity, the adverse effects of such decay are more likely to cause system failures when the corrupted executable code is finally run.

Two examples of devices which are often operated with extended periods of inactivity between peak periods of high use are printer controllers and handheld computing devices. FIG. 1 is an example of an application specific integrated circuit (ASIC) 10 that receives executable code from external non-volatile memory 12. The ASIC includes a processor 14 and embedded memory for handling instructions. The processor cooperates with the memory capability of ASIC for high speed access to compressed instructions that are originally stored in the external memory 12. The processor portion of the ASIC includes cache static random access memory (SRAM) 24 and a cache memory controller 22, while the embedded memory portion includes DRAM 26, SRAM 28, a second memory controller 30, and a bus 32.

In operation, the cache SRAM 24 operates as conventional on-chip cache. The cache memory controller 22 manages the use of the cache SRAM 24 to free and fill space for instructions that are likely to be requested (i.e., fetched)

by the processor 14. The embedded SRAM 28 and DRAM 26 may be managed by the second memory controller 30 to handle larger blocks of information for possible use by the processor. A printer having the ASIC is able to format incoming data in a page description language (PDL) and execute the instructions of a PDL interpreter program from cache, while the PDL program as a whole is stored in off-chip memory 12, which is typically memory of a host computer, such as a desktop computer.

There are a wide number of variations of ASICs that may be used in a printer, but each such circuit is likely to be operated in conditions in which it is "idle" for long periods between uses. It is during these idle times that soft errors are most likely to occur in the storage of executable code and/or data. Techniques for reducing such occurrences are known. For example, there are integrated circuit packaging materials that contain low levels of impurities that decay to generate alpha particles. By reducing the number of alpha particles that are generated, the statistical probability of a soft error is reduced. However, the cost of the materials is significantly greater than the cost of conventionally used packaging material. Thus, this solution increases the cost of integrated circuit chips.

Circuitry may be added to the device to provide detection of soft errors while the code is being run. One known scheme is to incorporate parity detection circuitry for detecting single and/or multiple bit errors. However, there is significant circuitry overhead that is added in providing the parity bit or bits. The additional circuitry increases the cost of the device. Another approach is to provide error-correction circuitry (ECC). ECC may be used to detect and correct single and/or multiple bit errors. The concerns with this approach are that there is an even greater increase in circuitry overhead that adds to the cost and there is additional complexity that can result in decreased performance in the SRAM/DRAM data path. The memory controller logic may become more complicated with the handling of extra processing states that may be required by the "repair" feature of the ECC.

What is needed is a low cost method and device for providing recovery from memory errors, particularly soft memory errors in executable code stored in volatile memory.

SUMMARY OF THE INVENTION

Managing volatile storage of information that is processed during operation of a device having extended periods of inactivity between periods of activity includes systematically checking the contents of volatile memory between periods of activity. In one application, the information is executable code for operating the device and the check of volatile memory is initiated upon detection of passage of a preselected time period. The volatile memory is random access memory that is particularly susceptible to soft memory errors, such as DRAM and SRAM. By limiting the volatile memory checking to times in which the device is inactive, there is no performance penalty resulting from the check. Moreover, by limiting the occurrences of volatile memory checking, the effect on power consumption can be managed. For example, the checking may be limited to once per hour or once per day. As an alternative to time-based checking, event-based checking can be utilized, such as initiating the volatile memory check of executable code immediately prior to use of the device following an extended period of inactivity.

In one embodiment of the invention, the system of managing volatile memory is implemented within an integrated circuit, such as an application specific integrated circuit (ASIC). The integrated circuit includes a processor, embedded volatile memory, and an integrated self-tester capability. The self-tester capability includes stored test code that is specific to detecting errors within the information (e.g., executable code) residing within the volatile memory. The stored test code includes instructions which implement memory testing routines. The test code may be stored within embedded non-volatile memory of the integrated circuit.

The self-testing capability also includes a module for triggering the execution of the stored test code. In the time-based embodiment, the module is a timing module which is coupled to an embedded clock or an external clock. The timing may identify times of day or may be based upon time increments since the last period of activity, such as initiating the test routines once per hour between periods of activity. Preferably, the memory checking capability is inhibited during periods of device activity.

The integrated circuit also includes a recovery module that is responsive to the self-testing capability to induce an operational sequence that transfers fresh information to the input of the volatile memory when the code error condition is detected. The memory checking may consist of a cyclic redundancy check (CRC) or a checksum on the entire memory space of the volatile memory. Alternatively, if sufficient non-volatile memory is available, a redundant copy of the entire volatile memory space can be stored and a "compare" routine may be run. Error correction is a possibility in the case that a code error condition is detected, but the preferred method is one in which the device reinitializes itself from the non-volatile memory and the information (e.g., executable code) is reloaded to the volatile memory. While not critical, the recovery module may include a "watchdog" that resets the system if a fatal error results in the checking routines being unintentionally terminated (such as by a system-wide "hang").

In addition to applications to ASICs, the techniques for managing the volatile storage of information may be applied to applications in which the volatile memory is external to the integrated circuit chip that includes the processor. Moreover, the techniques may be applied to other "semi-permanent" memory types that are potentially susceptible to soft errors, including flash memory, random access memory and magnetic memory.

As previously noted, an advantage of the invention is that because the volatile memory checking only occurs when the system is inactive ("idle"), there is no performance penalty that is imposed by the implementation of the invention. While the invention is particularly suited for use in checking soft errors introduced into executable code, the techniques may be applied to data sections of the volatile memory, if desired. Another advantage of the invention is that the timing of the error checking routines can be set so as to impose minimal additional power consumption. In the embodiment in which the error checking occurs within an ASIC of a printer, the power consumption is typically not a significant concern. However, for a handheld computing device or a cellular telephone, the low-power feature is significant.

BRIEF DESCRIPTION OF THE DRAWINGS

FIG. 1 is a block diagram of a prior art ASIC for use in a printer or the like.

DETAILED DESCRIPTION

Figure 1:
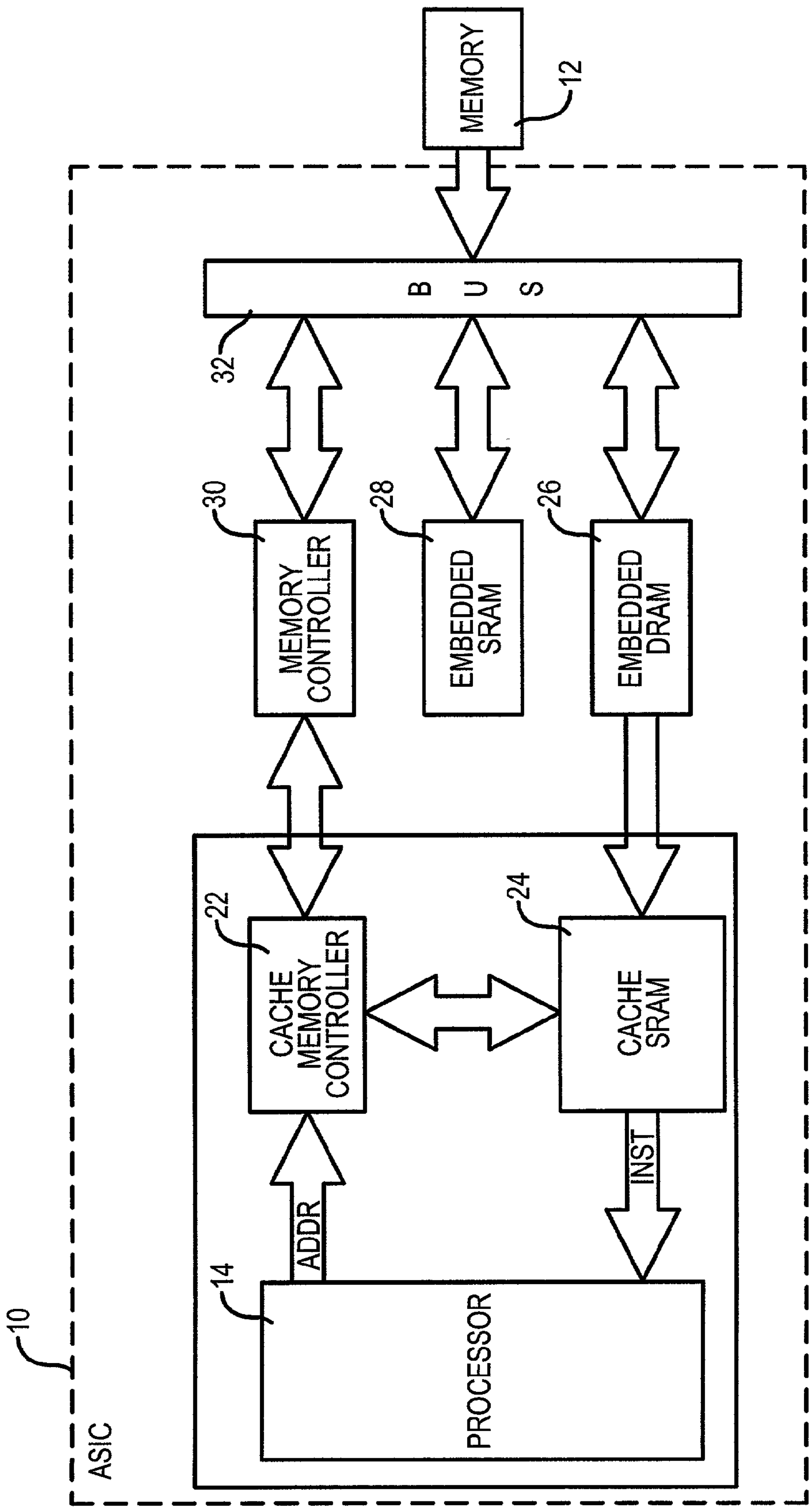
Figure 2:
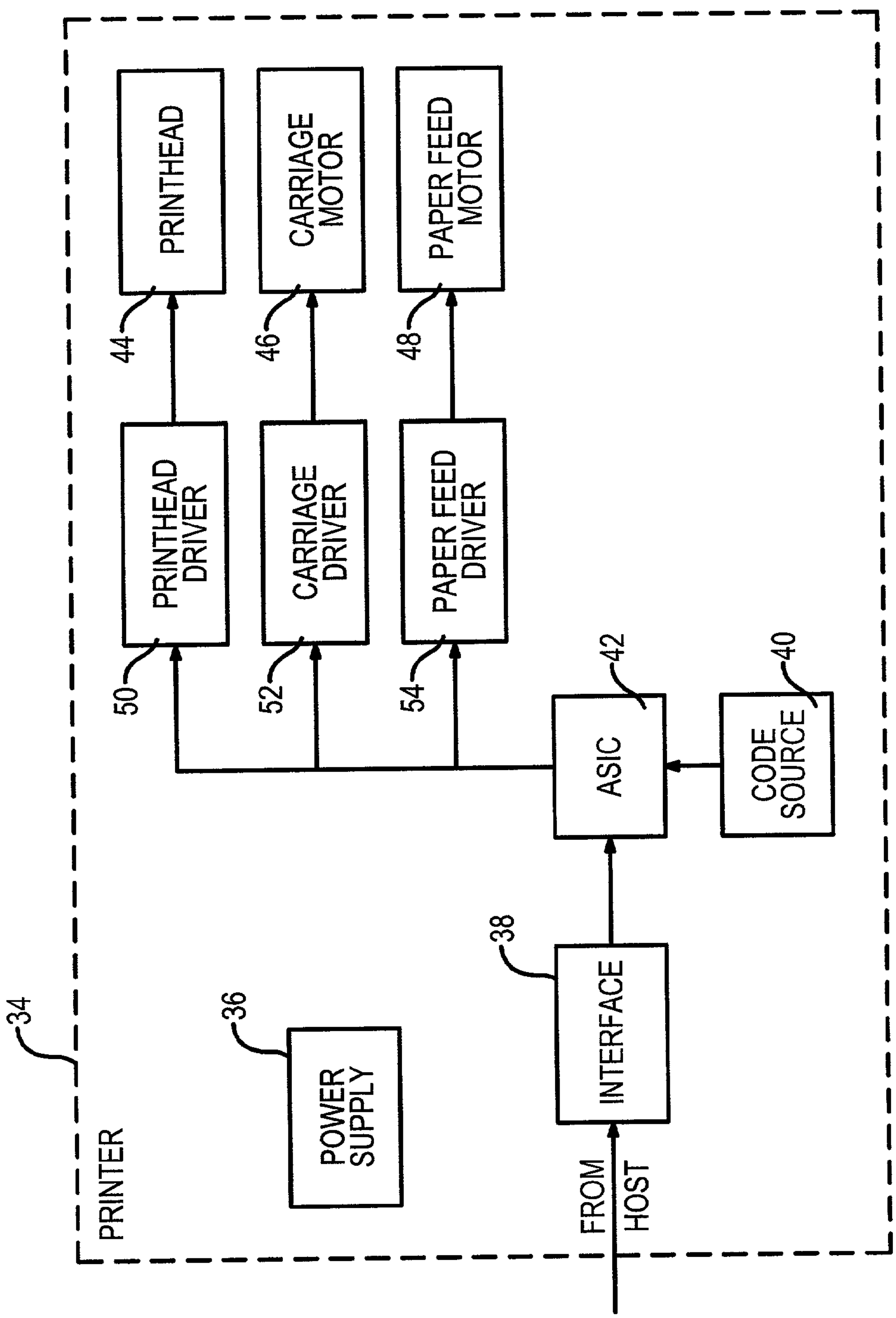
FIG. 2 is a block diagram of selected components of a printer that is suitable for use of the present invention.

With reference to FIG. 2, components within a printer 34 may include a power supply 36 and an interface 38. The invention will be described primarily with reference to use as a printer controller, but may be used in other applications. The invention is particularly suitable in applications which encounter long periods of inactivity between short periods in which demand is significant. The type of power supply 36 is not an issue, since the source of power may be external, such as a connection to an electrical power line, or may be a rechargeable battery. Similarly, the interface 38 may be any of the types of interfaces known in the art for communicating with a host for providing data. For example, the interface 38 may communicate with a host computer that provides user data to be printed, with the user data conforming to a page description language (PDL).

A printer 34 typically includes both volatile memory and memory. "Volatile memory" is defined herein in the conventional manner as memory in which data is lost when power to the memory is terminated. On the other hand, non-volatile memory retains information in power-off conditions. In FIG. 2, a code source 40 may be non-volatile memory for storing a control program, a number of fonts, and initial values for operating the printer. Volatile memory may be embedded within an ASIC 42 that will be described in greater detail with regard to FIGS. 3 and 4. Often, there is stand-alone volatile memory in addition to the embedded volatile memory.

The printer 34 may be an ink jet printer having a printhead 44, a carriage motor 46 that moves the printhead laterally, and a paper feed motor 48 that steps paper in a direction perpendicular to the path of the printhead-supporting carriage. While not shown in FIG. 2, the power supply is connected to both of the motors 46 and 48 and to the firing mechanism for the printhead 44. As is well known in the art, the operations of the two motors allow ink droplets to be sprayed by the printhead 44 onto a sheet of paper or other print medium in order to print text or an image onto the medium. The ASIC 42 controls the operations of the printhead and the two motors via drivers 50, 52 and 54. For a particular printing, signals to the drivers will depend upon the text or image to be formed.

Figure 3:
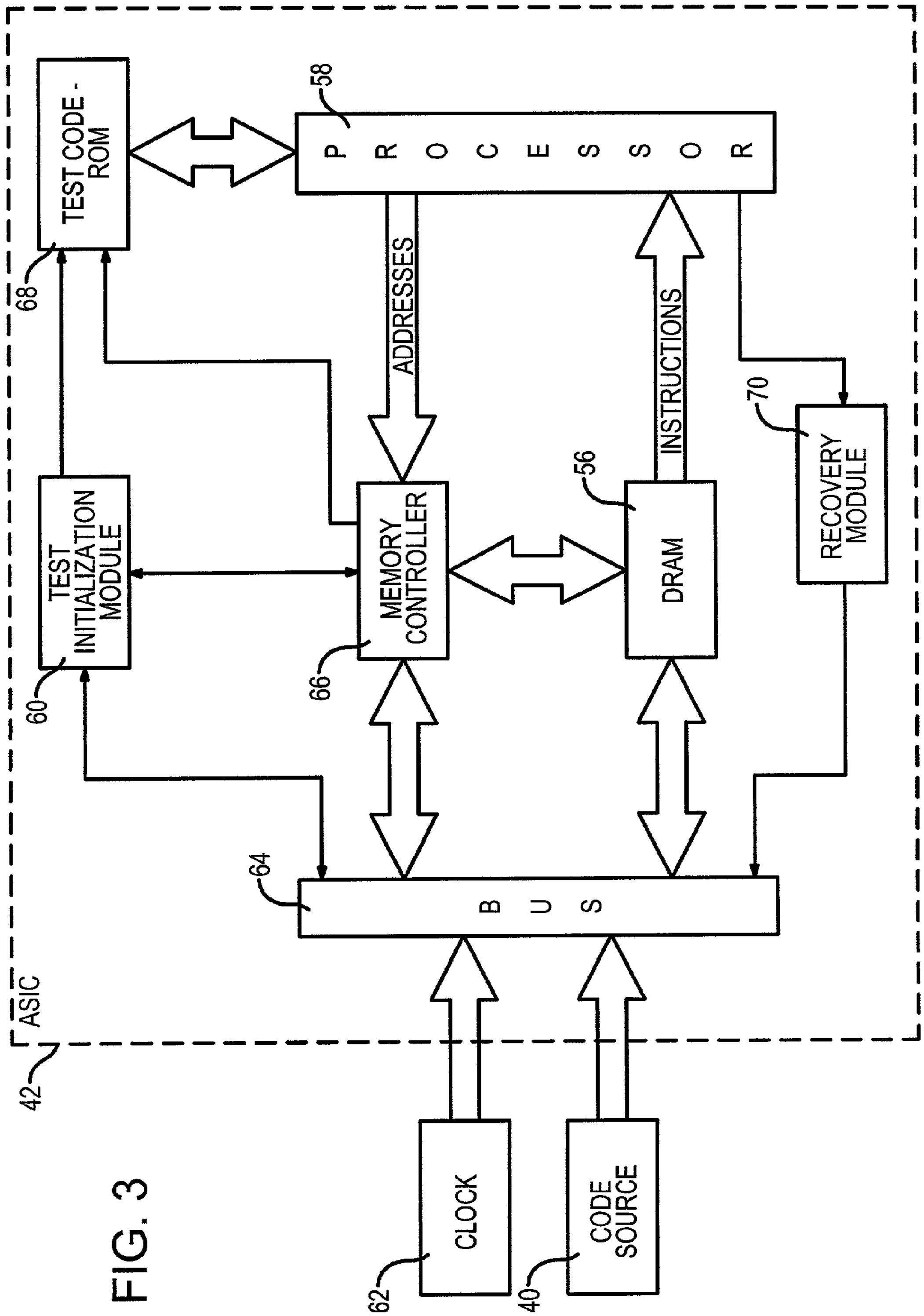
FIG. 3 is a block diagram of a first embodiment of an ASIC having volatile memory error checking in accordance with the invention.

Referring now to FIG. 3, one embodiment of the ASIC 42 is illustrated. In this embodiment, testing for soft errors within embedded volatile memory (i.e., DRAM 56) occurs internally. That is, the self-testing can be initiated and completed within the ASIC. On the other hand, the embodiment that will be described with reference to FIG. 4 implements some operations outside of the ASIC, so that a processor 58 is not utilized. While the invention will be described with regard to checking soft errors within a DRAM 56, this is not critical. SRAM is also susceptible to alpha particle-induced soft errors. Moreover, while the preferred embodiment is one in which the stored information that is being checked for soft errors is executable code within volatile memory embedded within an ASIC, the techniques can be expanded to detecting soft errors in other information (e.g., user data) and can be expanded to applications that do not include ASICs.

In one application of the invention, the self-testing for soft errors occurs as a function of time. Thus, a test initialization module 60 tracks time. Time increments may be based upon the time of day. For example, the self-testing may be initiated once per day at the same time of day or may be initiated once per hour. In a preferred embodiment, the timing is based upon the last use of the ASIC. Consequently, in the printer application, self-testing routines may be initiated after each increment of time starting from the termination of the previous print operation. The test initialization module 60 is connected to an external clock 62 via a bus 64, allowing the module to track time. Alternatively, a clock may be embedded within the ASIC to cooperate with the test initialization module in determining when self-testing should be initiated. While the test initialization module is shown as being a separate component within the ASIC 42, the term "module" is defined herein as encompassing circuit hardware, programming software, and a combination of circuit hardware and programming software.

The test initialization module 60 may also be event-based. That is, rather than triggering self-testing on the basis of timing, the module 60 may sense an event that causes the module to initiate the soft error testing routines. The most suitable event is the onset of a print operation. As another alternative to time-based testing, the basis for initiating the self-testing routines may be a combination of timing and event sensing. For example, initiating self-testing immediately before a print operation may be limited to occasions in which it has been an extended period of time (e.g., one hour) since the last print operation.

It should be noted that the timing is not based upon conventional DRAM refresh rates of the volatile memory. That is, the invention is distinguishable from conventional refresh operations. As another item of interest, the self-testing preferably is inhibited during print operations. Thus, the module 60 may include or may be connected to an interrupt controller that is coupled to the conventional memory controller 66 of the ASIC 42. Flags may be imposed which both ensure that print operations do not occur during self-testing and ensure that self-testing is not initiated during an ongoing print operation.

During normal use, the memory controller 66 and the DRAM 56 operate in a conventional manner. The on-chip processor 58 sends addresses to the memory controller which uses the addresses to determine which instructions of the DRAM-stored executable code are to be sent to the processor. While not shown in FIG. 3, the ASIC 42 typically includes non-volatile memory that is connected to the DRAM. In FIG. 3, the executable code is shown as originating from the code source 40 that is external to the ASIC. However, the ASIC does include non-volatile read only memory (ROM) 68 that stores the test code which is used by the processor 58 in performing the self-testing. As a consequence of having the stored test code, printer firmware is able to perform volatile memory checking periodically when the system is inactive.

The checking routines of the test code that resides within the ROM 68 are not critical to the invention. In one embodiment, the volatile memory check consists of calculating a cyclic redundancy check (CRC) or checksum of the entire code space of the DRAM 56. The CRC may generate a polynomial with terms fed back at various stages so as to detect errors within the executable code sent from the DRAM 56 to the processor 58. If there is sufficient available non-volatile memory, a redundant copy of the entire code space may be stored, allowing a "compare" routine. In some applications, it may be possible to provide error correction, but this is not critical.

A recovery module 70 is activated if a specific error condition is detected. The error condition may merely be a first detection that there is an error within the executable code. On the other hand, more error-tolerant systems may not be adversely affected by a single error, so that the recovery module is activated only if multiple errors are detected or if a system-threatening error is detected. Activation of the recovery module causes the device (e.g., the printer) to reinitialize itself from the non-volatile memory 40 and a request for a fresh firmware download is sent to the host. As an added feature, the recovery module 70 may include a "watchdog" capability in which the system is reset if the system freezes during a memory checking routine.

Figure 4:
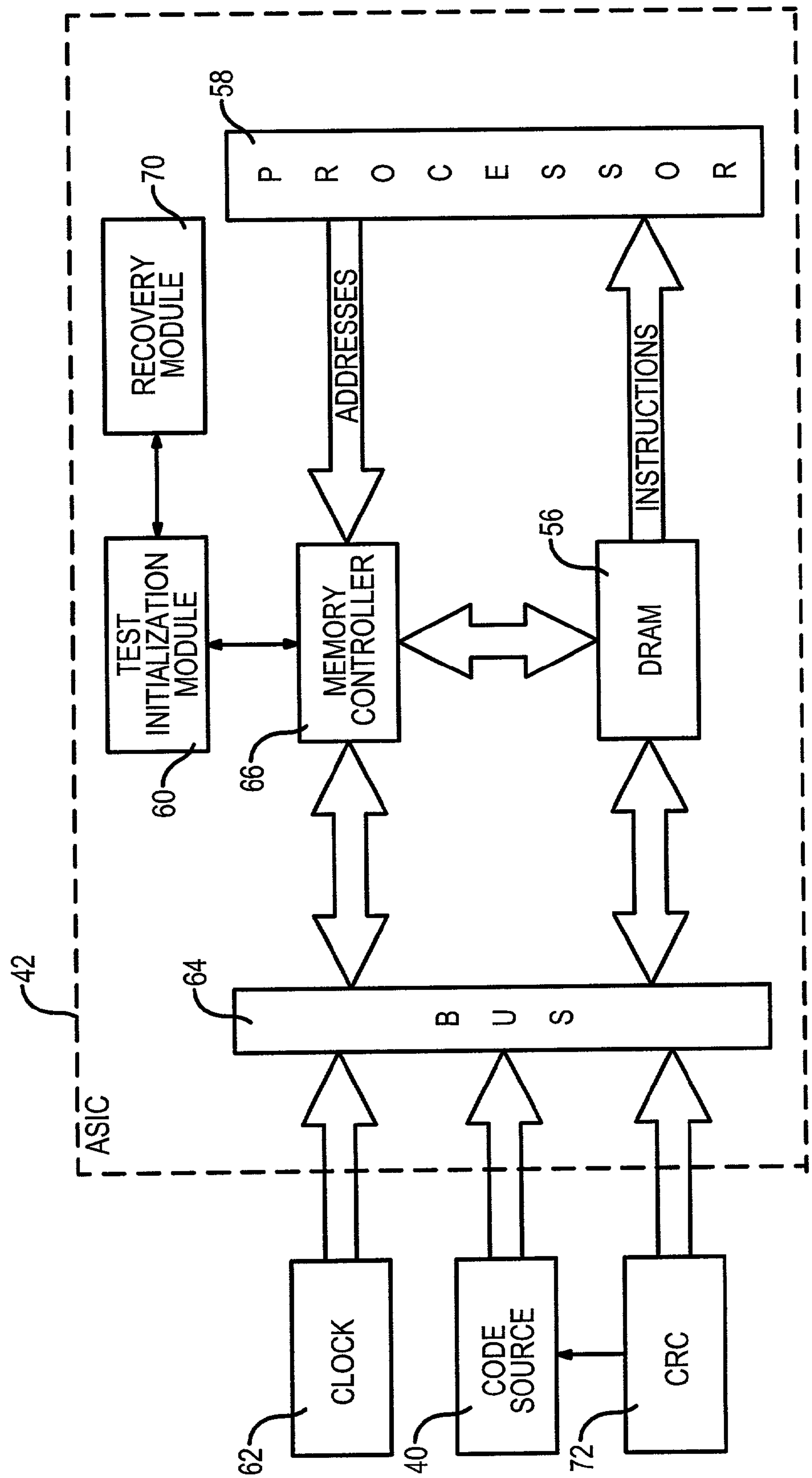
FIG. 4 is a block diagram of a second embodiment of an ASIC having volatile memory error checking in accordance with the invention.

A second embodiment of the invention is shown in FIG. 4. Because many of the components of FIG. 4 are identical to the components of FIG. 3, the reference numerals have been duplicated. Briefly, executable code is stored in the DRAM 56 to allow the processor 58 to efficiently access instructions. Memory addresses of the instructions are sent from the processor to the memory controller 66, which translates the information and appropriately controls the DRAM 56. Other on-chip memory is not shown in FIG. 4.

The significant difference between the embodiment of FIG. 4 and the embodiment of FIG. 3 is that the processor 58 can be isolated from the error checking routines, since an off-chip CRC module 72 can be used to cooperate with a central processing unit (CPU) during the testing routines. In this embodiment, the recovery module 70 may also be located off-chip. However, the recovery module is preferably integrated with the other components of the chip. As in FIG. 3, the term "module" is defined broadly as being one or both of circuitry hardware and programming software.

Figure 5:
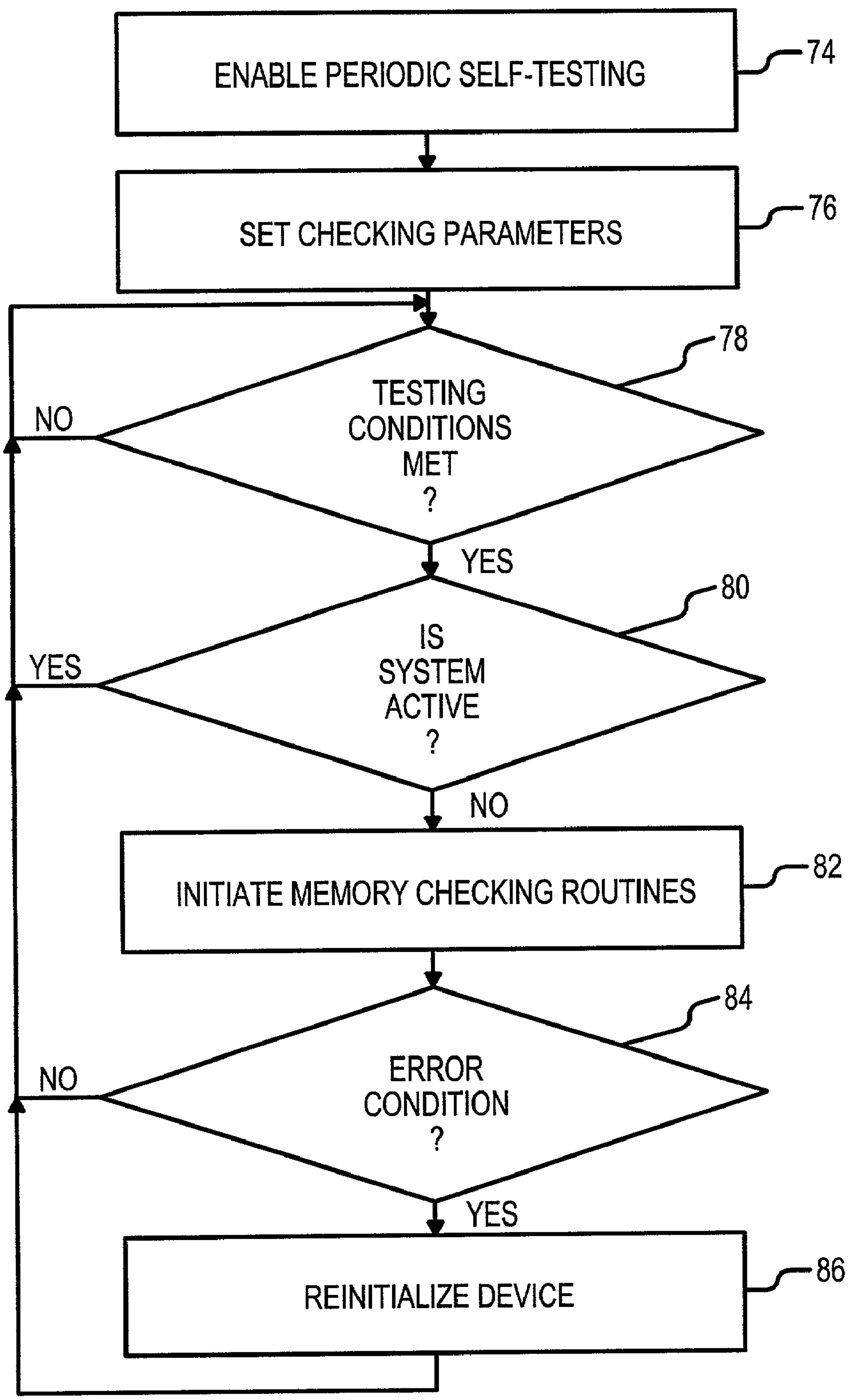
FIG. 5 is a process flow of steps in accordance with one application of the invention.

In order to more clearly describe the invention, FIG. 5 is presented as one possible sequence of steps that may be followed. In step 74, the periodic self-testing is enabled. This includes providing the necessary software and hardware. In the embodiment in which the self-testing is implemented within an ASIC 42 of the type shown in FIG. 3, the enabling step includes loading the test code within the ROM 68.

At step 76, the memory checking parameters are set. This includes establishing the conditions for initiating the checking routines. As previously noted, the conditions for initiation may be time based, event based (such as immediately prior to each use of the device in which the ASIC 42 resides), or a combination of timing and event occurrences.

As the device (e.g., the printer) is left in a power-on state, the self-testing capability will loop through determinations at step 78, until an affirmative response is made to the issue of whether the testing conditions have been met. Thus, if the testing conditions are merely time-based, the affirmative response occurs when the appropriate time has passed, such as one hour. In the preferred embodiment, the process then moves to a step 80 of determining whether the system is presently active, but step 80 is not critical. In the printer application, if a print operation is occurring at the time that the affirmative response occurs at step 78, the process loops back to the input at step 78. Thus, if the system is active, the self-testing will not be initiated at the specified time. In essence, it will be assumed that the system activity will provide evidence that the executable code is not corrupt. Alternatively, an affirmative response at step 80 will cause a loop back onto itself, so that the memory checking routines will be initiated at step 82 as soon as the system is inactive.

The memory checking may consist of calculating the CRC or checksum on the entire code space of the volatile memory being checked. As previously noted, if sufficient memory is available, a redundant copy of the entire code space may be generated and a "compare" routine may be run. In step 84, if it is determined that a specific error condition exists, the device may reinitialize itself from the non-volatile memory and a fresh set of executable code may be sent to the volatile memory. The device reinitialization is represented by step 86. The process then returns to the input of step 78.

While the invention has been described primarily with regard to use with on-chip volatile memory, the memory management techniques can be extended to stand-alone volatile memory chips and even to storage of information within similar types of "semi-permanent memory," i.e., memory that is susceptible to losses in the form of soft errors. These other types of memory include ROM, flash memory, and magnetic memory.

What is claimed is:

1. A system for managing volatile storage of information for operating a device having extended periods of inactivity between periods of activity comprising:

volatile memory connected to receive said information from a source and enabled to retain said information during power-on conditions;

processing circuitry coupled to said volatile memory to process said information during said periods of activity;

a volatile memory checker enabled to execute between said periods of activity, said volatile memory checker including test code configured to detect soft errors within said information retained in said volatile memory, said volatile memory being susceptible to soft errors; and said soft errors detected via execution of said volatile memory checker being soft errors occurring during said extended periods of inactivity between said periods of activity of said device;

wherein said volatile memory checker includes a timing module enabled to tripper execution of said test code in response to detection of expiration of a preselected time period and simultaneous detection that said device is in a period of inactivity.

2. The system of claim 1 wherein said volatile memory, said processing circuitry and said volatile memory checker are integrated into a single integrated circuit chip, said test code being configured to detect soft errors.

3. The system of claim 2 wherein said volatile memory is one or both of dynamic random access memory (DRAM) and static random access memory (SRAM) embedded within said integrated circuit chip, said processing circuitry including a processing unit.

4. The system of claim 1 further comprising a recovery module responsive to said volatile memory checker to selectively trigger information replacement for said volatile memory upon detecting said errors, said information being executable code for operating said device.

5. The system of claim 4 wherein said recovery module is configured to selectively reinitialize said device to initiate a transfer of said executable code from said source to said volatile memory.

6. The system of claim 4 wherein said recovery module is configured to selectively reset said device in response to a system-wide error in execution of said executable code.

7. The system of claim 4 wherein said volatile memory checker is configured to perform a cyclic redundancy check (CRC) or checksum of executable code memory space of said volatile memory.

8. The system of claim 1 wherein said volatile memory, said processing circuitry and said volatile memory checker are integrated into an application specific integrated circuit (ASIC) of a printer controller.

9. The system of claim 1 wherein said volatile memory and said processing circuitry are housed within separate integrated circuit chips.

10. A method of assessing integrity of executable code comprising the steps of:

transferring said executable code into volatile memory of a device that is activated upon execution of said executable code, said device being in an inactive state between executions of said executable code;

performing time-based volatile memory checking routines in response to detecting that said device is in said inactive state and a preselected time period has elapsed, including checking code space of said volatile memory to detect soft errors within said executable code, said volatile memory being susceptible to said soft errors, wherein said soft errors are those errors occurring within said executable code during said inactive state between said executions of said executable code, said inactive state being a passage of time during which said device is idle; and initiating a selected response upon detecting fatal code error during performing said checking routines.

11. The method of claim 10 wherein said step of performing said routines includes calculating a cyclic redundancy check (CRC) or checksum for executable code space of said volatile memory.

12. The method of claim 10 wherein said step of initiating said selected response includes triggering a reinitialization that repeats said step of transferring said executable code into said volatile memory.

13. The method of claim 12 wherein said step of initiating further includes resetting said device in response to a code error that results in said checking routines being terminated.

14. The method of claim 10 wherein said step of transferring includes loading said executable code into random access memory embedded in an integrated circuit having a central processor.

15. The method of claim 14 wherein said step of performing said checking routines includes scheduling said checking routines to occur on a periodic basis.

16. An integrated circuit comprising:

a processor;

embedded volatile memory having an input to receive executable code that includes instructions specific to operations of said processor;

an integrated self-tester having stored test code specific to detecting code error in said executable code during storage in said volatile memory, said self-tester being responsive to a time-based test initialization signal for triggering periodic testing, said time-based test initialization signal being dependent upon a passage of time intervals related to the time of day; and a recovery module responsive to said self-tester to induce an operational sequence that transfers fresh executable code to said input of said volatile memory when said self-tester detects a specific code error condition.

17. The integrated circuit of claim 16 wherein said volatile memory is one or both of dynamic random access memory (DRAM) and static random access memory (SRAM), said specific code error condition including alpha particle-induced error detections that are pre-identified as being fault conditions.

18. The integrated circuit of claim 16 wherein said self-tester includes embedded non-volatile memory for storing said test code.

19. The integrated circuit of claim 16 wherein said processor and said executable code are specific to operating within a printer controller.

20. The integrated circuit of claim 16 wherein said recovery module includes code for inducing reinitialization in which said volatile memory is reloaded with said executable code from a source of said executable code.

21. A system for managing information storage comprising the steps of:

storing said information within memory that is susceptible to occurrences of soft errors, said memory being within a device that is characterized by extended periods of inactivity between periods of activity, said extended periods of inactivity being a passage of time during which said device is idle;

processing circuitry coupled to said memory to process said information during said periods of activity; and an automated memory checker enabled to execute between said periods of activity, said automated memory checker being configured to execute test code on a timed basis to detect said soft errors within said information stored in said memory, said time basis being dependent upon a passage of time intervals related to a time of day, said soft errors of interest being those errors occurring during said extended periods of inactivity between said periods of activity.

22. The system of claim 21 wherein storing said information in memory includes magnetically recording said information on a medium susceptible to said occurrences of soft errors.

23. The system of claim 21 wherein storing said information includes embedding said information within non-volatile memory housed within an integrated circuit chip, wherein said non-volatile memory is susceptible to said occurrences of soft errors.

* * * * *